US010763190B2

(12) United States Patent
Tsuyuno et al.

(10) Patent No.: US 10,763,190 B2
(45) Date of Patent: Sep. 1, 2020

(54) POWER SEMICONDUCTOR MODULE, POWER CONVERSION DEVICE USING SAME, AND METHOD FOR MANUFACTURING POWER CONVERSION DEVICE

(71) Applicant: Hitachi Automotive Systems, Ltd., Ibaraki (JP)

(72) Inventors: Nobutake Tsuyuno, Tokyo (JP); Morio Kuwano, Hitachinaka (JP); Takeshi Tokuyama, Tokyo (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 107 days.

(21) Appl. No.: 16/099,651

(22) PCT Filed: May 11, 2016

(86) PCT No.: PCT/JP2016/063942
§ 371 (c)(1),
(2) Date: Nov. 7, 2018

(87) PCT Pub. No.: WO2017/195283
PCT Pub. Date: Nov. 16, 2017

(65) Prior Publication Data
US 2019/0157185 A1   May 23, 2019

(51) Int. Cl.
*H01L 23/495* (2006.01)
*H01L 23/34* (2006.01)
(Continued)

(52) U.S. Cl.
CPC ............ *H01L 23/473* (2013.01); *H01L 21/52* (2013.01); *H01L 24/29* (2013.01); *H01L 24/33* (2013.01);
(Continued)

(58) Field of Classification Search
CPC ....... H01L 23/473; H01L 21/52; H01L 24/29; H01L 23/49568; H01L 21/56;
(Continued)

(56) References Cited

U.S. PATENT DOCUMENTS 7,816,786 B2* 10/2010 Nakatsu ................ H01L 25/071
257/691
8,675,364 B2* 3/2014 Tokuyama ............ B60K 6/365
361/715
(Continued)

FOREIGN PATENT DOCUMENTS

| JP | 2007-250918 A | 9/2007 |
| JP | 2008-244379 A | 10/2008 |
| JP | 2012-28595 A | 2/2012 |

OTHER PUBLICATIONS

International Search Report dated Jul. 19, 2016 in PCT/JP2016/063942.

*Primary Examiner* — Alonzo Chambliss
(74) *Attorney, Agent, or Firm* — Foley & Lardner LLP

(57) ABSTRACT

Provided is a compact power conversion device which is excellent in liquid tightness and has high reliability of a terminal connection portion. A power conversion device according to the present invention includes: a case that houses a power semiconductor; a flow path forming body that forms a flow path with an outer surface of the case; a first fixing material in contact with a refrigerant flowing in the flow path; and a second fixing material that is in contact with the first fixing material and the flow path forming body and covers a direction of displacement of the case of the first fixing material caused by water pressure.

14 Claims, 21 Drawing Sheets

(51) Int. Cl.
| | |
|---|---|
| *H01L 23/06* | (2006.01) |
| *H01L 21/00* | (2006.01) |
| *H01L 23/473* | (2006.01) |
| *H01L 25/18* | (2006.01) |
| *H01L 25/07* | (2006.01) |
| *H05K 7/20* | (2006.01) |
| *H01L 21/52* | (2006.01) |
| *H01L 23/00* | (2006.01) |
| *H02M 7/00* | (2006.01) |
| *H02M 7/537* | (2006.01) |

(52) U.S. Cl.
CPC .............. *H01L 25/07* (2013.01); *H01L 25/18* (2013.01); *H02M 7/003* (2013.01); *H02M 7/537* (2013.01); *H05K 7/20* (2013.01); *H01L 2224/05554* (2013.01); *H01L 2224/29191* (2013.01); *H01L 2224/33* (2013.01); *H01L 2224/48091* (2013.01); *H01L 2224/48247* (2013.01)

(58) Field of Classification Search
CPC ......... H01L 24/33; H01L 25/07; H01L 25/18; H02M 7/003; H02M 7/537; H05K 7/20
See application file for complete search history.

(56) References Cited

U.S. PATENT DOCUMENTS

| | | | |
|---|---|---|---|
| 10,037,977 B2* | 7/2018 | Lei | ................. H01L 23/473 |
| 2007/0096278 A1* | 5/2007 | Nakatsu | ................. H01L 25/071 |
| | | | 257/678 |
| 2009/0160048 A1* | 6/2009 | Nakatsu | ................. H01L 25/072 |
| | | | 257/714 |
| 2012/0119347 A1* | 5/2012 | Mamitsu | ................. H01L 25/115 |
| | | | 257/698 |
| 2013/0119525 A1 | 5/2013 | Tsuyuno et al. | |
| 2016/0322281 A1* | 11/2016 | Shintani | ............ H01L 23/49838 |

* cited by examiner

FIG. 22

| | | | EXAMPLE 1 | EXAMPLE 2 | EXAMPLE 3 | EXAMPLE 4 |
|---|---|---|---|---|---|---|
| CONFIGURATION | FIRST FIXING MATERIAL | MATERIAL | MOISTURE-CURABLE SILICONE RESIN CURED PRODUCT | THERMOSETTING SILICONE RESIN CURED PRODUCT | URETHANE RESIN CURED PRODUCT | URETHANE/EPOXY GRADED RESIN CURED PRODUCT |
| | | ELASTIC MODULUS | 2MPa | 2MPa | 2MPa | 2MPa |
| | SECOND FIXING MATERIAL | MATERIAL | EPOXY RESIN CURED PRODUCT | EPOXY RESIN CURED PRODUCT | PPS | URETHANE/EPOXY GRADED RESIN CURED PRODUCT |
| | | ELASTIC MODULUS | 15GPa | 15GPa | 18GPa | 15GPa |
| EFFECT | SIZE OF SEAL STRUCTURE | | ○ | ○ | ○ | ○ |
| | LIQUID TIGHTNESS OF SEAL STRUCTURE | | ○ | ○ | ○ | ○ |
| | RELIABILITY OF TERMINAL CONNECTION PORTION | | ◎ | ◎ | ◎ | ◎ |
| | PRODUCTION SPEED OF SEAL STRUCTURE | | △ | ○ | ○ | ○ |
| | ENERGY DURING PRODUCTION OF SEAL STRUCTURE | | ○ | ○ | ○ | ○ |

FIG. 23

| | | | EXAMPLE 5 | COMPARATIVE EXAMPLE 1 | COMPARATIVE EXAMPLE 2 | COMPARATIVE EXAMPLE 3 |
|---|---|---|---|---|---|---|
| CONFIGURATION | FIRST FIXING MATERIAL | MATERIAL | TAPE-LIKE SEAL | O-RING | EPOXY RESIN CURED PRODUCT | MOISTURE-CURABLE SILICONE RESIN CURED PRODUCT |
| | | ELASTIC MODULUS | 300MPa | 7MPa | 15GPa | 2MPa |
| | SECOND FIXING MATERIAL | MATERIAL | UV-CURABLE RESIN CURED PRODUCT | NONE | NONE | NONE |
| | | ELASTIC MODULUS | 2.5GPa | — | — | — |
| EFFECT | SIZE OF SEAL STRUCTURE | | ○ | × | ○ | ○ |
| | LIQUID TIGHTNESS OF SEAL STRUCTURE | | ○ | ○ | × | ○ |
| | RELIABILITY OF TERMINAL CONNECTION PORTION | | ○ | ◎ | ◎ | × |
| | PRODUCTION SPEED OF SEAL STRUCTURE | | ◎ | ◎ | ○ | △ |
| | ENERGY DURING PRODUCTION OF SEAL STRUCTURE | | ◎ | ◎ | ○ | ◎ |

POWER SEMICONDUCTOR MODULE, POWER CONVERSION DEVICE USING SAME, AND METHOD FOR MANUFACTURING POWER CONVERSION DEVICE

TECHNICAL FIELD

The present invention relates to a power semiconductor module, a power conversion device using the same, and a method for manufacturing the power conversion device, and more particularly to a power conversion device including a power semiconductor module having a power semiconductor element.

BACKGROUND ART

Power conversion devices using switching of power semiconductor elements have high conversion efficiency, and thus, have been widely used for consumer use, automotive use, railway use, substation equipment, and the like. The power semiconductor element generates heat by energization, and thus, requires high power dissipation and is cooled by using air or a liquid. In particular, a power semiconductor module having a large heat generation uses a cooling system using a liquid, and thus, it is important to provide a seal that secures liquid tightness of a refrigerant flow path on which the power semiconductor module is mounted. PTL 1 is disclosed as a structure in which a power semiconductor module is mounted on a refrigerant flow path and then is sealed.

CITATION LIST

Patent Literature

PTL 1: JP 2007-250918 A

SUMMARY OF INVENTION

Technical Problem

In a semiconductor device described in PTL 1, an O-ring is used for sealing. Thus, it is necessary to compress the O-ring by a predetermined amount in order to secure liquid tightness, and both the semiconductor device side and the flow path side require high rigidity. Thus, there are problems that a seal structure becomes large and a material for compressing the O-ring is limited to a metal material.

An object of the present invention is to achieve miniaturization while securing reliability.

Solution to Problem

A power conversion device according to the present invention includes: a case that houses a power semiconductor; a flow path forming body that forms a flow path with an outer surface of the case; a first fixing material in contact with a refrigerant flowing in the flow path; and a second fixing material that is in contact with the first fixing material and the flow path forming body and covers a direction of displacement of the case of the first fixing material caused by water pressure, in which any one of or both the first fixing material and the second fixing material have adhesiveness.

Advantageous Effects of Invention

According to the present invention, miniaturization is achieved while securing reliability.

BRIEF DESCRIPTION OF DRAWINGS

FIG. 22 is Correspondence Table 1 of a first fixing material 901 and a second fixing material 902 according to the present embodiment.

FIG. 23 is Correspondence Table 2 of the first fixing material 901 and the second fixing material 902 according to the present embodiment.

DESCRIPTION OF EMBODIMENTS

Hereinafter, a description will be given regarding embodiments of a power semiconductor module and a power conversion device according to the present invention with reference to the drawings. Incidentally, the same elements will be denoted by the same reference signs in the respective drawings, and the redundant description thereof will be omitted.

Example 1

Figure 1:
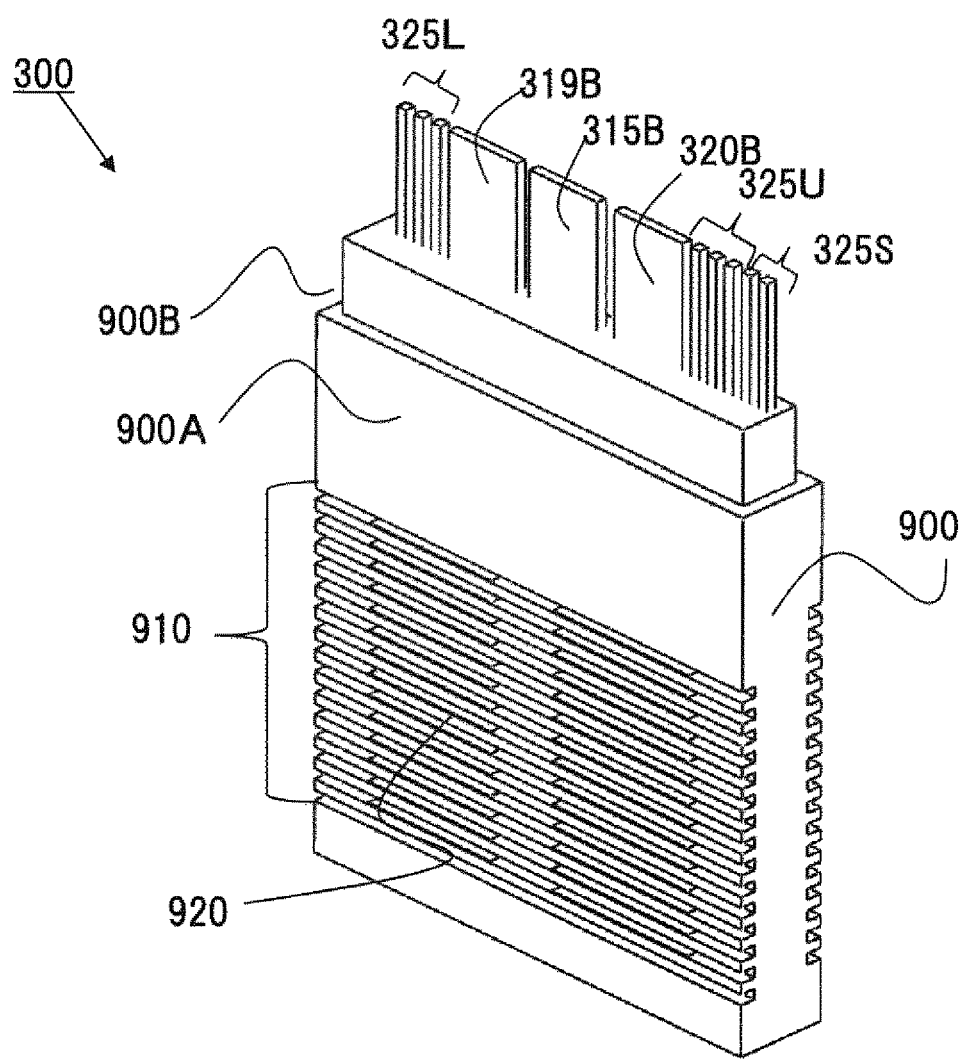
FIG. 1 is a perspective view of a power semiconductor module 300 according to Example 1.

FIG. 1 is a perspective view of a power semiconductor module 300 of the present embodiment. The power semiconductor module 300 includes: a sealing resin 900 as a case that houses a power semiconductor; terminals 315B and 319B on a DC side; a terminal 320B on an AC side; and signal terminals 325U, 325L, and 325S.

The sealing resin 900 seals a power semiconductor element mounted on a metal conductor such as a lead frame 315 and a ceramic substrate wiring to be described later. The terminal 315B, the terminal 319B, and the terminal 320B protrude from one surface of the sealing resin 900 and are arranged in a line such that side surfaces of adjacent terminals oppose each other. A step, configured to form a seal structure in a seal portion 900B, is formed on the sealing resin 900 on a side where these terminals protrude.

When the power semiconductor module 300 is fixed to a flow path forming body 1000, a first fixing material 901 and a second fixing material 902 arranged on the seal portion 900B secure liquid tightness of a cooling refrigerant as will be described later. In addition, the sealing resin 900 has a sealing resin surface 900A. A manufacturing procedure of the power semiconductor module 300 of the present example will be described with reference to FIGS. 2 to 7.

Figure 2:
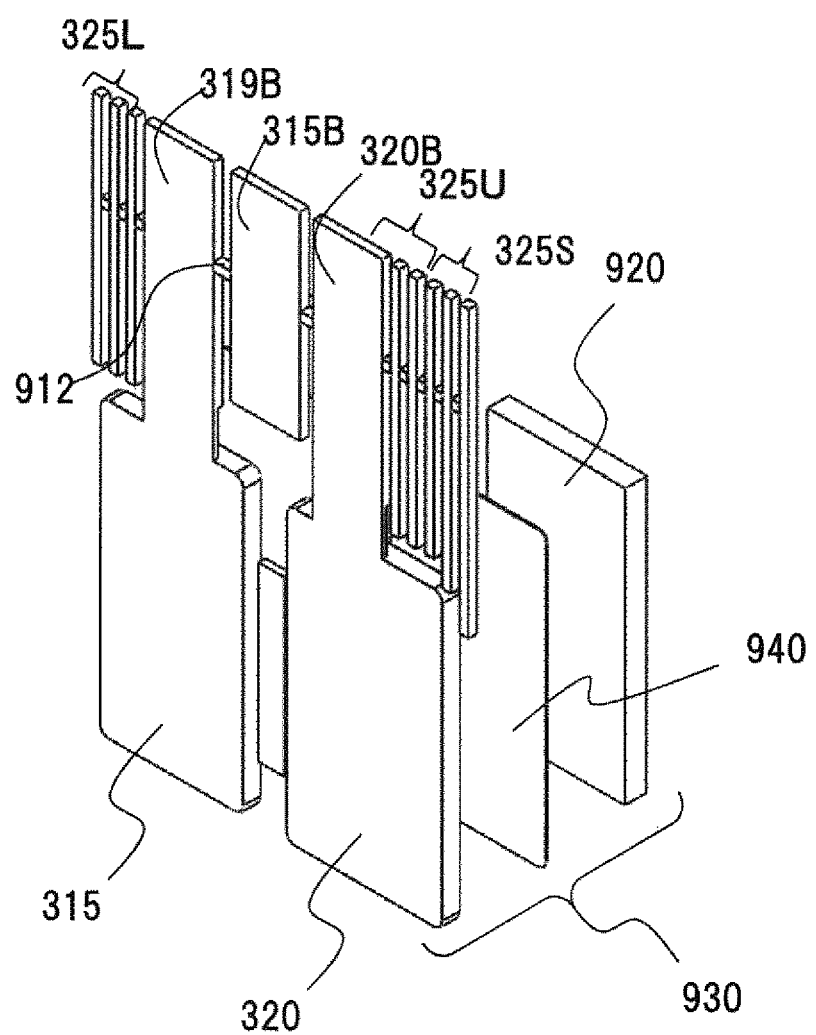
FIG. 2 is a developed perspective view of a connector-side lead set 930 according to the present embodiment.

FIG. 2 is a developed view illustrating an arrangement relationship between a lead frame 315 and a lead frame 320, and a high thermal conductor 920. An IGBT 155 on an upper arm side which is a power semiconductor element to be described later is connected to the lead frame 315. An IGBT 157 on a lower arm side which is a power semiconductor element to be described later is connected to the lead frame 320. The lead frame 315 and the lead frame 320 are made of a conductive metal member, for example, copper, aluminum, or the like. Here, the IGBT is an abbreviation for an insulated gate bipolar transistor.

The high thermal conductor 920 is arranged on a side opposite to a side where the power semiconductor element is connected with the lead frame 315 or the lead frame 320 sandwiched therebetween. The high thermal conductor 920 is provided to correspond to each lead frame. Although not illustrated in FIG. 2, the high thermal conductor 920 is also arranged in a region opposing the lead frame 315.

An insulating layer 940 is arranged between the high thermal conductor 920 and the lead frame 315 and between the high thermal conductor 920 and the lead frame 320. The insulating layer 940 is a member that is arranged for the purpose of electrical insulation between the lead frame 320 and the high thermal conductor 920. As the insulating layer 940, for example, an epoxy resin-based resin sheet filled with alumina particles and boron nitride particles or an insulating ceramic plate of alumina, silicon nitride, aluminum nitride, or the like is used. The high thermal conductor 920 is attached to the lead frame 320 with the insulating layer 940 interposed therebetween. When the resin sheet is used, the insulating layer 940 is thermally pressed and cured using a vacuum press machine. When the ceramic plate is used, the insulating layer 940 is produced by molten metal pouring by causing molten metal to flow into a mold.

The lead frame 315 and the lead frame 320 are formed in the state of being connected by a tie bar 912. Thus, the high thermal conductor 920 and the lead frame 320 are assembled as an integrated collector-side lead set 930 with the insulating layer 940 sandwiched therebetween.

Figure 3:
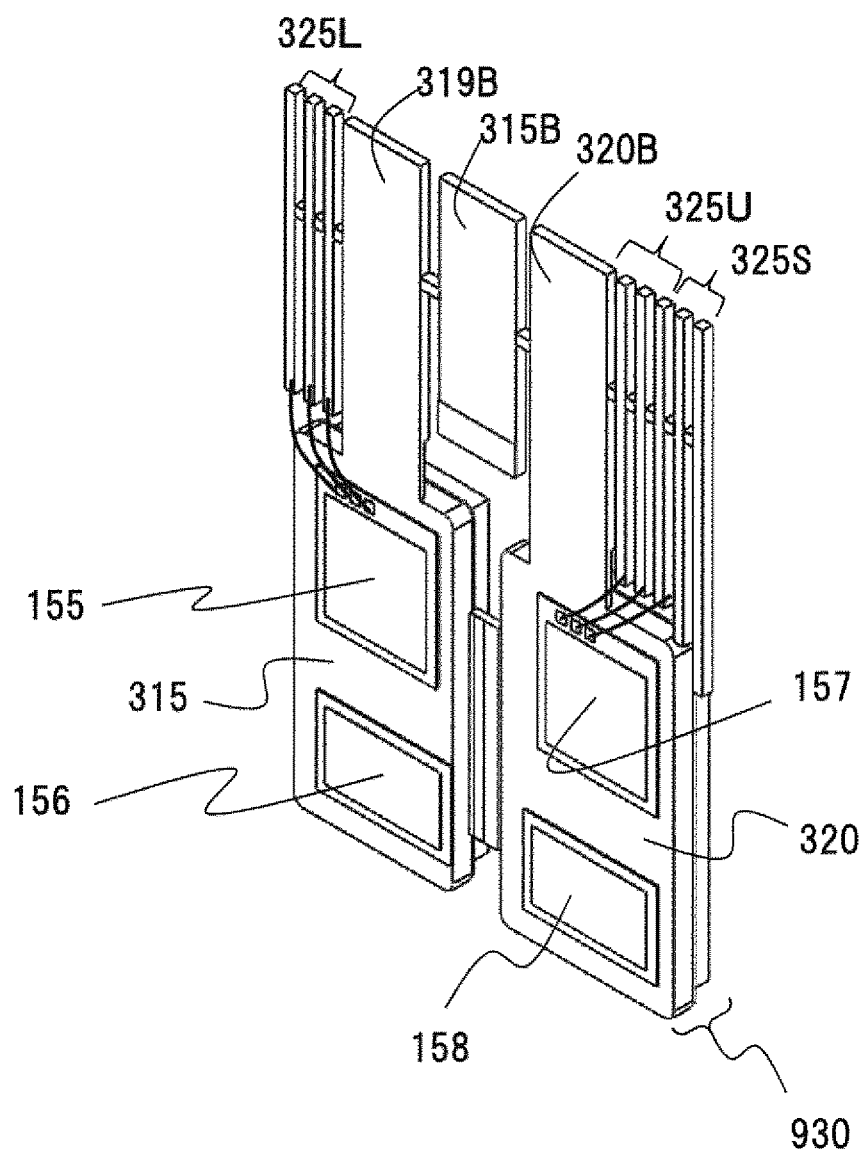
FIG. 3 is a perspective view in the middle of manufacturing the power semiconductor module 300 according to the present embodiment.

FIG. 3 is a view illustrating a state where the power semiconductor is connected to the lead frames 315 and 320 from the state of FIG. 2. The upper arm IGBT 155 forming an upper arm circuit of an inverter circuit is solder-connected to the lead frame 315. A diode 156 forming the upper arm circuit of the inverter circuit is solder-connected to the lead frame 315. The lower arm IGBT 157 forming a lower arm circuit of the inverter circuit is solder-connected to the lead frame 320. A diode 158 forming the lower arm of the inverter circuit is solder-connected to the lead frame 320. The IGBTs 155 and 157 have signal electrodes each of which is formed on a surface on a side where an emitter electrode is formed. The signal electrodes are electrically connected to the signal terminals 325L and 325L of the power semiconductor module 300 using aluminum wires. Thus, the IGBTs 155 and 157 are arranged at positions closer to the signal terminals than the diodes 156 and 158.

Figure 4:
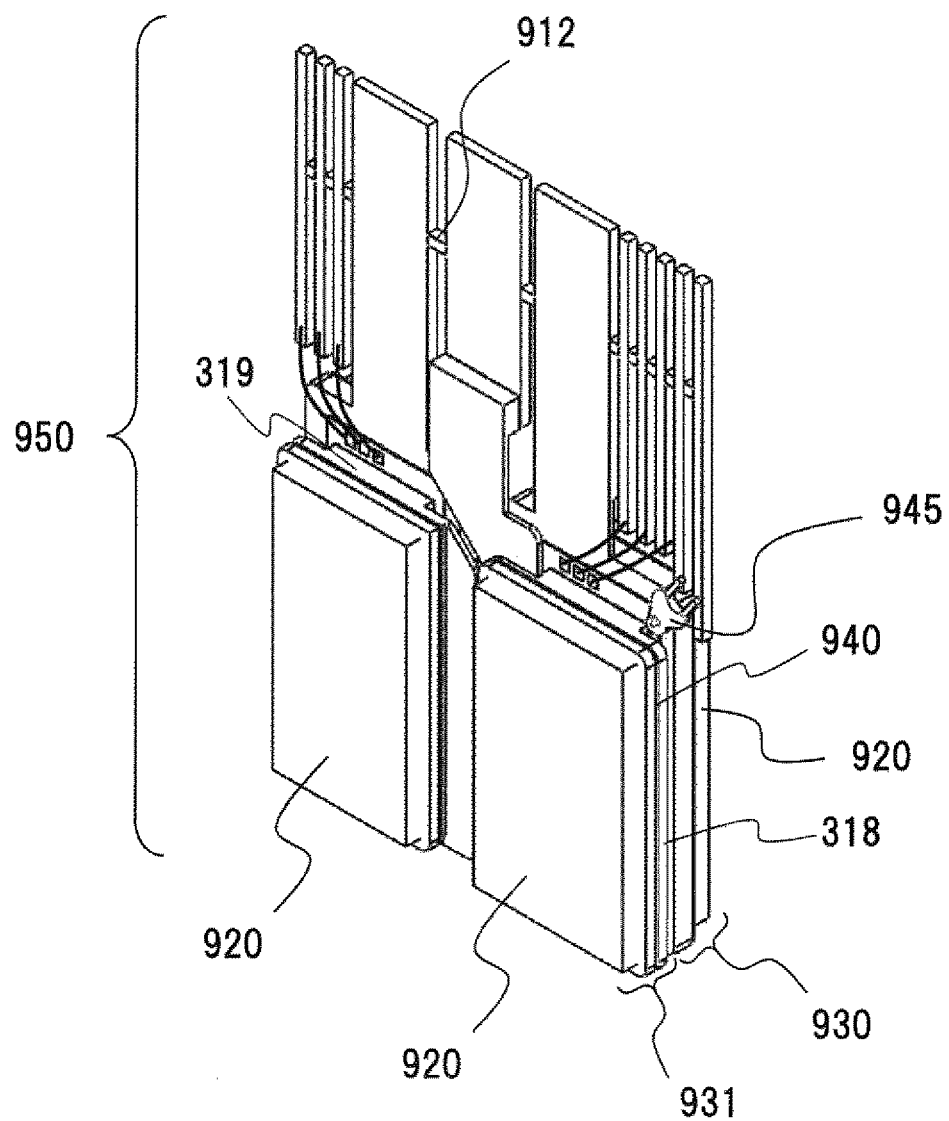
FIG. 4 is a perspective view in the middle of manufacturing the power semiconductor module 300 according to the present embodiment.

FIG. 4 is a view illustrating a state where the lead frame and the high thermal conductor 920 are arranged on the emitter electrode side of the power semiconductor element from the state of FIG. 3. As a procedure, first, an emitter-side lead set 931 is formed in the same manner as the collector-side lead set 930 is formed in FIG. 2. The emitter-side lead set 931 is constituted by a lead frame 318 connected to the emitter electrode side of the IGBT 155 or a lead frame 319 connected to the emitter electrode side of the IGBT 157, the high thermal conductor 920, and the insulating layer 940.

In addition, a temperature sensor 945 is attached to the lead frame 318 or 320. A terminal of the temperature sensor 945 is welded to a signal terminal of the collector-side lead set 930. It is possible to monitor heat generation when forming a fin 910A by machining and perform management such that the temperature does not exceed a specified value by providing the temperature sensor 945 as will be described later with reference to FIG. 7.

In this manner, the collector-side lead set 930 and the emitter-side lead set 931 are arranged to oppose each other so as to sandwich the power semiconductor. An assembly of the collector-side lead set 930 and the emitter-side lead set 931 is referred to as a lead assembly 950.

Figure 5:
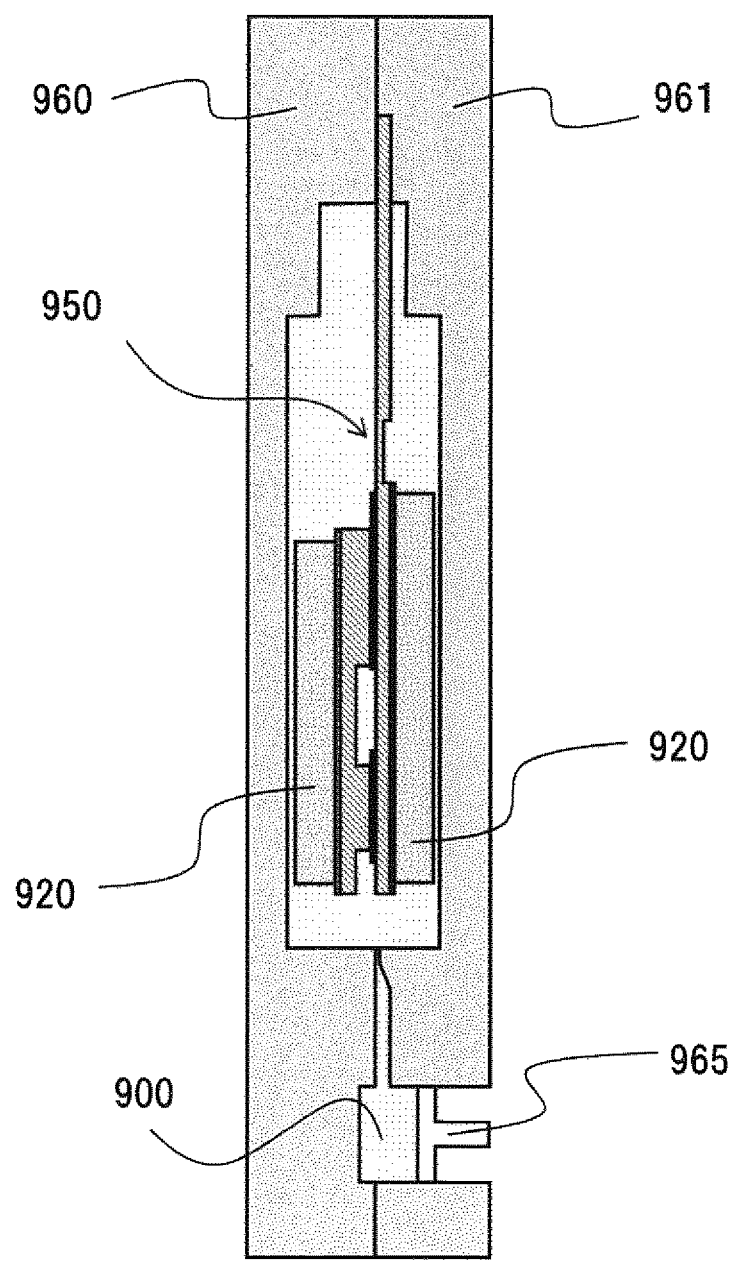
FIG. 5 is a cross-sectional view in the middle of manufacturing the power semiconductor module 300 according to the present embodiment.

FIG. 5 is a view illustrating a process of transfer-molding the lead assembly 950. The lead assembly 950 is set in transfer molding dies 960 and 961, and the sealing resin 900 is injected by a plunger 965. The sealing resin 900 was cured in the die for 3 minutes with a molding temperature of 175° C. and a molding pressure of 10 MPa.

Figure 6:
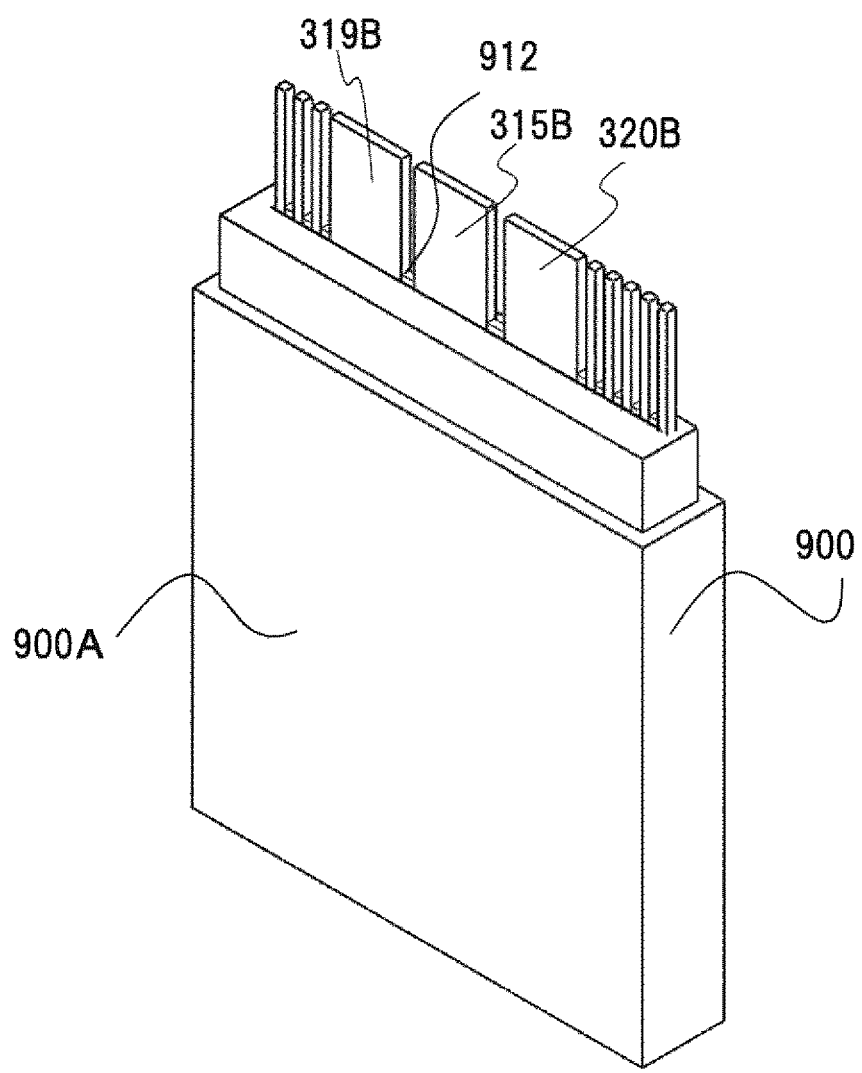
FIG. 6 is a perspective view in the middle of manufacturing the power semiconductor module 300 provided with a sealing resin 900 according to the present embodiment.

FIG. 6 illustrates the lead assembly 950 obtained by transfer-molding the sealing resin 900. The high thermal conductor 920 is covered with the sealing resin 900. The sealing resin 900 has a sealing resin surface 900A consisting of substantially the same plane including a region covering the high thermal conductor 920.

The tie bar 912 connecting the terminals is cut after transfer molding. As a result, the terminals are electrically separated from each other.

Figure 7:
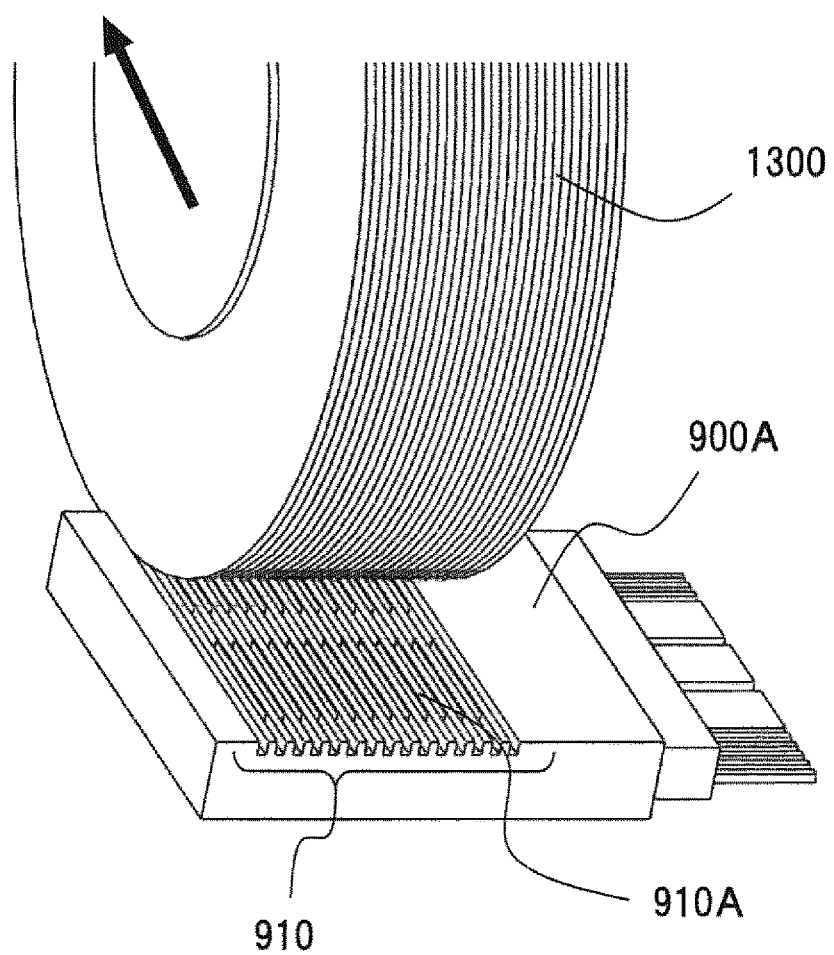
FIG. 7 is a perspective view in the middle of creating a fin 910A of the power semiconductor module 300 according to the present embodiment.

FIG. 7 is a view illustrating a process of grinding the sealing resin surface 900A to form the fin 910A. The sealing resin surface 900A is ground by rotating a multi-blade 1300 at high speed. The multi-blade 1300 has a structure in which a plurality of blades having abrasive grains attached to distal ends thereof is bundled. The multi-blade 1300 grinds the high thermal conductor 920 together with the sealing resin 900. The ground high thermal conductor 920 forms the fin 910A. A groove depth between the fins 910A is about 1.5 mm. A portion where the fin 910A is formed functions as a heat-dissipating portion 910.

The portion to be ground generates heat by frictional heat during grinding, and thus, is cooled by injecting cooling water. In addition, an internal temperature is monitored using the temperature sensor 945 or the like provided inside the power semiconductor module 300, and grinding speed is adjusted such that the internal temperature does not exceed 150° C. As a result, it is possible to prevent remelting of solder due to the frictional heat. In addition, it is possible to easily manufacture the fin 910A by grinding using the multi-blade 1300.

Figure 8:
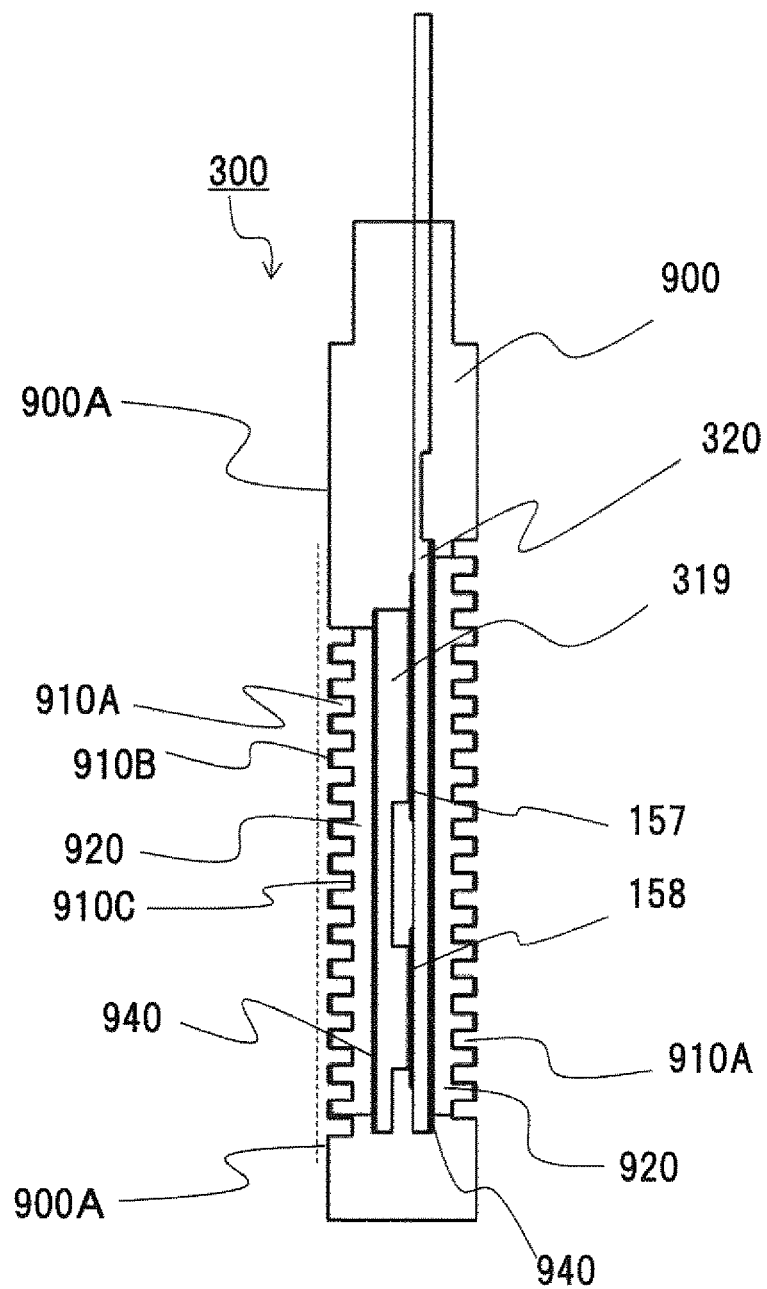
FIG. 8 is a cross-sectional view of the power semiconductor module 300 of Example 1.

FIG. 8 is a cross-sectional view of the power semiconductor module 300. As illustrated in FIG. 8, the portion to be ground by the multi-blade 1300 in the procedure of FIG. 7 corresponds to a portion where the high thermal conductor 920 is arranged. That is, a part of the high thermal conductor 920 is scraped off. In the power semiconductor module 300 of the present example, the fin 910A is formed on both sides of the power semiconductor.

In FIG. 8, the lead frames 319 and 320 are arranged so as to sandwich the lower-arm-side IGBT 157 and the diode 158. The high thermal conductor 920 is arranged on a side opposite to a side where the lower-arm-side IGBT 157 is arranged with the lead frame 319 sandwiched therebetween. Similarly, the high thermal conductor 920 is arranged on a side opposite to a side where the power lower-arm-side IGBT 157 is arranged with the lead frame 320 sandwiched therebetween. The insulating layer 940 is arranged between the high thermal conductor 920 and the lead frame 319 or 320.

As indicated by a dotted line in FIG. 8, the fin 910A is formed such that a distal end of the fin 910A is substantially flush with the sealing resin surface 900A. In other words, the fin 910A is formed from a heat-dissipating surface 910C formed so as to be recessed with respect to the sealing resin surface 900A toward a side opposite to a side where the power semiconductor element is arranged.

In addition, since the fin 910A is formed as illustrated in FIG. 7, a sealing resin piece 910B is arranged at the distal end of the fin 910A. In this manner, the distal end of the fin 910A is originally formed as the sealing resin 900 so as to be substantially flush with the sealing resin surface 910A as illustrated in FIG. 6.

The power semiconductor module 300 of the present embodiment described above is processed into the fin shape by grinding a resin sealing portion sealing the high thermal conductor 920. Incidentally, the heat-dissipating portion 910 is formed by the grinding method as illustrated in FIG. 7 in the present example, but may be realized by another machining. Since the periphery of the high thermal conductor 920 is sealed with the sealing resin 900, it is difficult for the high thermal conductor 920 to be peeled off even when a temperature change is applied. In addition, since the fin 910A is formed after resin sealing, the sealing resin 900 does not leak out to the fin portion in the course of manufacturing, and a yield is improved.

It is possible to use a metal material having high thermal conductivity or a carbon-containing material as a material of the high thermal conductor 920. For example, it is possible to use copper, aluminum, copper carbon, aluminum carbon, graphene, or the like. When an aluminum-based material or a carbon-containing material is used, there are effects that cutting becomes easy and productivity is improved.

It is possible to use a transfer-mold resin, a potting resin, a silicone resin, or the like as a material of the sealing resin 900 although not particularly limited. When the transfer mold resin is used, there are effects that productivity is high and external shape accuracy is high.

Figure 9:
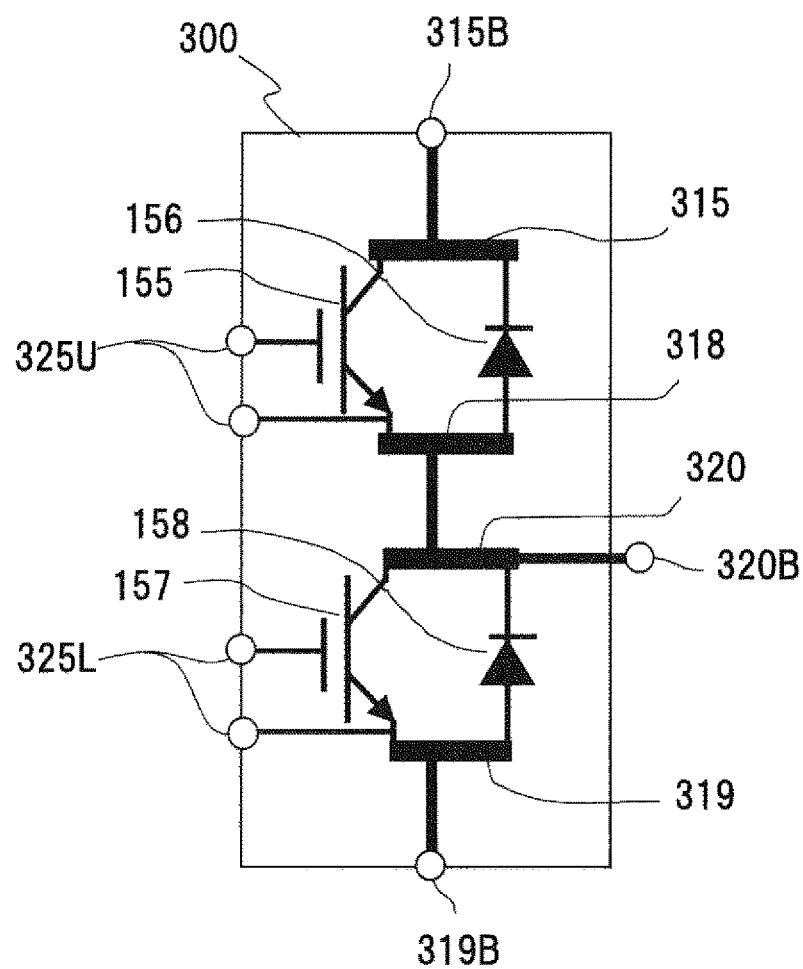
FIG. 9 is a circuit diagram of a power semiconductor module according to the present embodiment.

FIG. 9 is a circuit diagram of the power semiconductor module 300 of the present embodiment. The terminal 315B is output from the collector side of the upper arm circuit and is connected to a positive electrode side of a battery or a capacitor. The terminal 325U is output from a gate and a sense emitter of the IGBT 155 of the upper arm circuit. The terminal 319B is output from the emitter side of the lower arm circuit, and is connected to a negative electrode side of the battery or the capacitor, or to GND. The terminal 325L is output from a gate and a sense emitter of the IGBT 157 of the lower arm circuit. The terminal 320B is output from the collector side of the lower arm circuit and is connected to a motor. When neutral grounding is used, the lower arm circuit is connected not to GND but to the negative electrode side of the capacitor.

The power semiconductor module 300 of the present example is a 2-in-1 structure which is a structure in which two arm circuits of an upper arm circuit and a lower arm circuit are integrated into one module. When a 3-in-1 structure, a 4-in-1 structure, a 6-in-1 structure, or the like other than the 2-in-1 structure is used, it is possible to achieve miniaturization by reducing the number of output terminals from the power semiconductor module.

Figure 10:
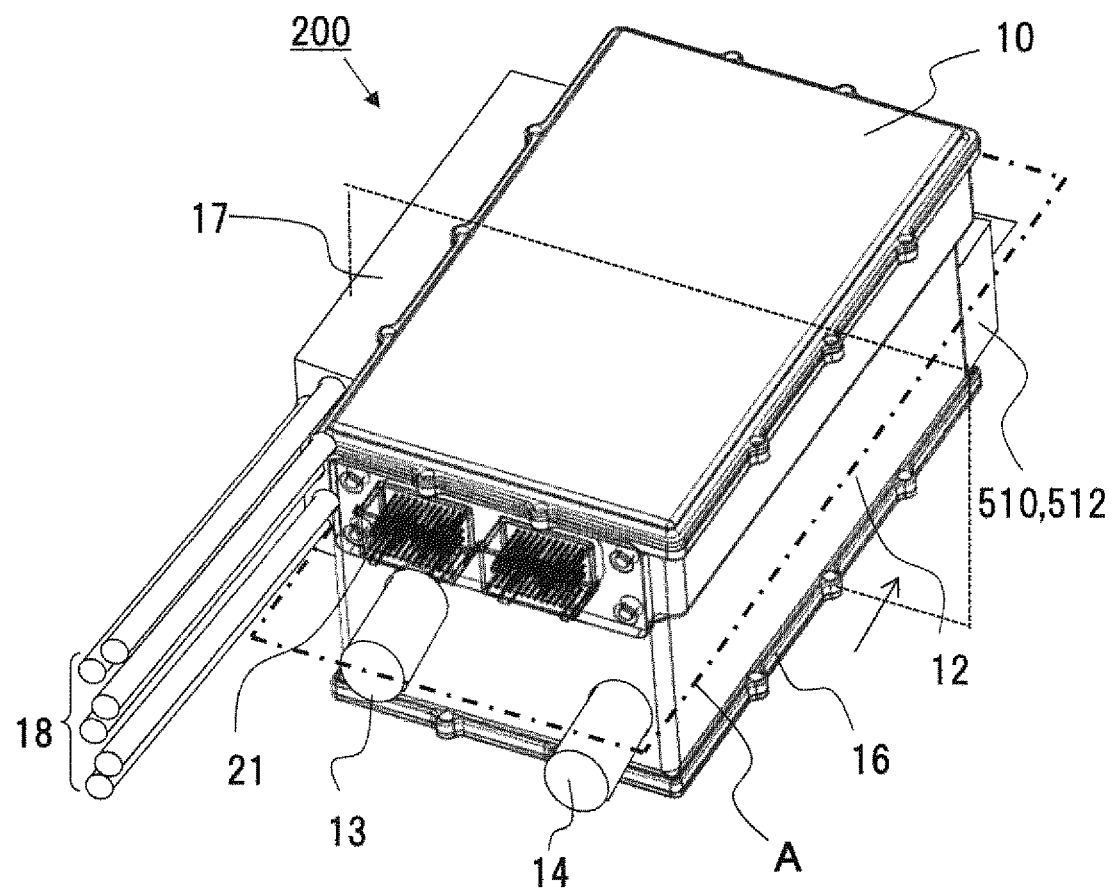
FIG. 10 is a perspective view of a power conversion device 200 according to the present embodiment.

FIG. 10 is a perspective view illustrating an appearance of the power conversion device 200. The appearance of the power changing device 200 according to the present embodiment is formed by fixing a housing 12 having a substantially rectangular top or bottom surface, an upper case 10 provided on one of outer circumferences on a short side of the housing 12, and a lower case 16 for closing a lower opening of the housing 12. A cable 18 transmits an alternating current to the motor. The connector 17 is connected to the cable 18 and is connected to one side surface of the housing 12. DC power supply connectors 510 and 512 are connected to the one side surface of the housing 12 that transmits a DC current to the power semiconductor module 300 and to which the connector 17 is connected.

A signal connector 21 transmits a signal for driving the power semiconductor module 300 or the like. The signal connector 21 is connected to a side surface different from the one side surface of the housing 12 to which the connector 17 and the DC power supply connectors 510 and 512 are connected. A cooling water inlet 13 and a cooling water outlet 14 are connected to the one side surface of the housing 12 to which the signal connector 21 is connected.

Figure 11:
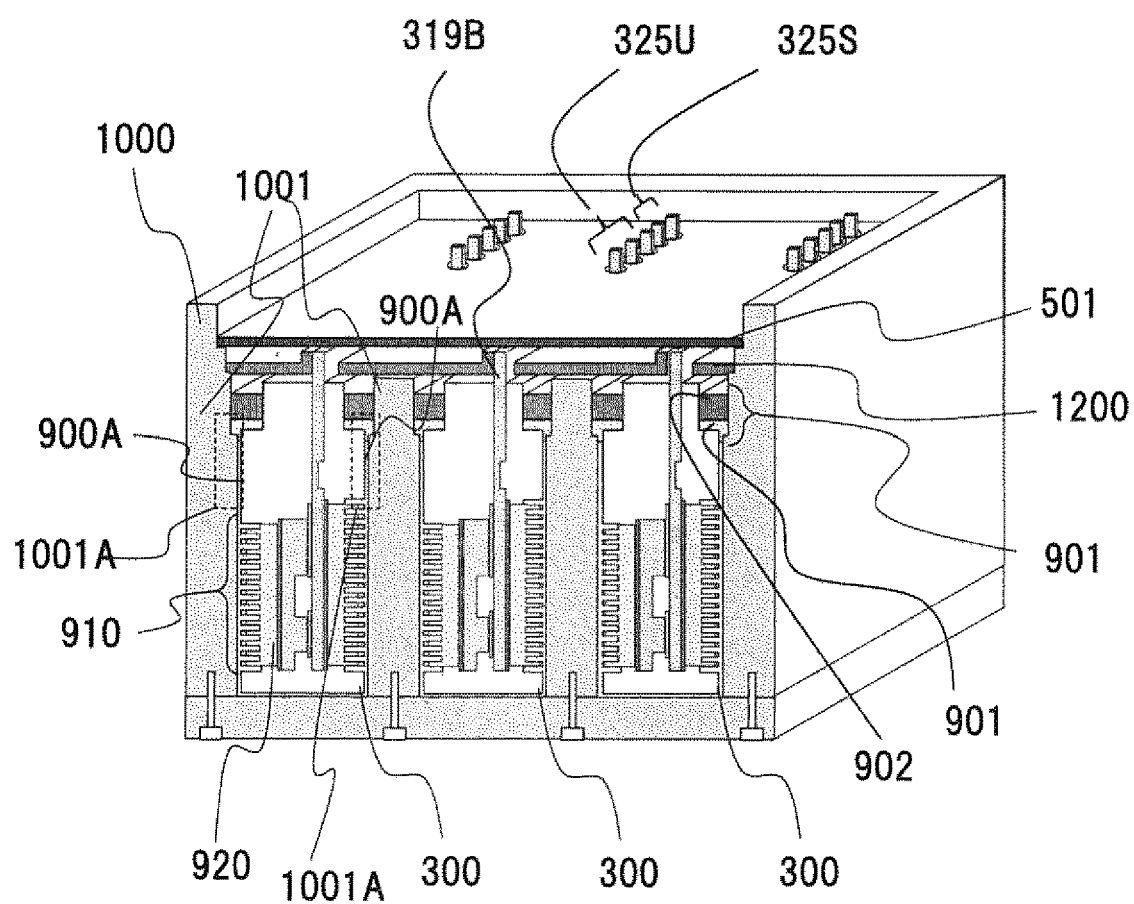
FIG. 11 is a cross-sectional perspective view of the power conversion device 200 according to the present embodiment.

FIG. 11 is a schematic view illustrating a sectional structure of the power conversion device 200. The power semiconductor module 300 is installed in the flow path forming body 1000. The flow path forming body 1000 forms a refrigerant flow path through which a refrigerant cooling the power semiconductor module 300 flows. The flow path forming body 1000 has a wall surface 1001. The wall surface 1001 forms a flow path through which the refrigerant flows between the heat-dissipating portion 910 of the power semiconductor module 300 and the wall surface 1001. The wall surface 1001 has a planar structural portion 1001A such that no refrigerant flows between the sealing resin surface 900A of the power semiconductor module 300 and the wall surface 1001. The flow path forming body 1000 is formed such that a distance between the wall surfaces 1001 opposing each other and a distance between the sealing resin surface 900A on one side of the power semiconductor module 300 and the sealing resin surface 900A on the other side are substantially equal.

The seal portion 900B of the power semiconductor module 300 includes the first fixing material 901 and the second fixing material 902. The first fixing material 901 is at least attached to seal a gap of about 0.5 mm between the sealing resin surface 900A, formed of the sealing resin as the case housing the power semiconductor, and the wall surface 1001. The second fixing material 902 is in contact with the first fixing material 901 and the wall surface 1001 and covers at least a direction of displacement of the case accommodating the power semiconductor caused by water pressure.

The first fixing material 901 is desirably made of a material having a low elastic modulus so as to seal the narrow gap of approximately 0.5 mm between the sealing resin surface 900A and the wall surface 1001. This is because a difference in displacement of the sealing resin surface 900A and the wall surface 1001 due to water pressure, vibration, and heat is applied to this seal portion so that it is difficult to follow the displacement difference and a liquid leakage easily occurs in the case of using a material having a high elastic modulus. The material having the low elastic modulus in the present embodiment means a material having a storage elastic modulus of 0.1 MPa or higher and 1 GPa which is obtained by a dynamic viscoelasticity test. This is because the amount of deformation caused by water pressure is large so that it is difficult to secure liquid tightness over a long period of time when the elastic modulus is lower than 0.1 MPa, and it is difficult to follow the displacement difference between the sealing resin surface 900A and the wall surface 1001 due to water pressure, vibration, or heat and the reliability of liquid tightness is low when the elastic modulus is higher than 1 GPa.

As the first fixing material 901, a moisture-curable silicone resin cured product having an elastic modulus of 2 MPa was used. The first fixing material 901 is silicone resin, and thus, is excellent in water resistance. In addition, the moisture-curable silicone resin is cured in one to several days by absorbing moisture in the air, and thus, does not require a heating step, which is advantageous in terms that low energy is required during production. Incidentally, a criterion for excellent water resistance in the present embodiment is a weight loss rate of 10% or less after 168 hours in a saturated steam environment of 2 atm at 120° C. It is desirable that the first fixing material 901 in contact with the refrigerant be excellent in water resistance in order to satisfy long-term reliability. In addition, it is necessary for the first fixing material 901 not to leak from the gap to the fin 910A while filling the gap. Thus, it is desirable to have a thixotropy of 1.5 or higher. The thixotropy in the present embodiment is a value obtained by dividing a viscosity at a shear rate of 1 (1/s) by a viscosity at a shear rate of 10 (1/s). By setting the thixotropy to 1.5 or higher, it is possible to prevent the leakage while keeping a viscosity at the time of coating low so that there is an effect that productivity is excellent. It is also effective to apply a structure in which the gap is locally narrowed to the case side or the wall side in order to prevent the leakage.

The second fixing material 902 comes into direct contact with the case housing the power semiconductor or into contact with the case with the first fixing material 901 interposed therebetween, thereby preventing deformation of the case caused by water pressure. Thus, it is desirable that the second fixing material 902 be made of a material having a high elastic modulus. The material having the high elastic modulus in the present embodiment means a material having a storage elastic modulus of 4 GPa or higher which is obtained by a dynamic viscoelasticity test. It is because a thickness required to suppress the deformation caused by to water pressure is large so that there is no merit of size reduction compared with an O-ring structure when the elastic modulus is lower than 4 GPa.

As the second fixing material 902, a thermosetting epoxy resin cured product having an elastic modulus of 15 GPa was used. A curing condition is three hours at 120° C. and curing by heating is necessary, and thus, energy is required during production, but there are advantages that a curing time is short and the productivity is excellent. In addition, the epoxy resin has a high elastic modulus and excellent adhesiveness, and thus, has effects of suppressing deformation of the first fixing material and improving the connection reliability of the power semiconductor module terminal by adhering to the case housing the power semiconductor and a water path forming body. The power conversion device 200 includes a stacked wiring board 501 and a plate 1200.

After inserting the power semiconductor module 300 into the flow path forming body 1000, the terminals 319B through which a large current flows and the terminal 315B and the terminal 320B (not illustrated) are welded to terminals protruding from the plate 1200 in which bus bar wirings are stacked in multiple layers. Further, the stacked wiring board 501 on which mounting parts are placed is assembled, and the signal terminals 325U and 325S, and the terminal 325L (not illustrated) and the stacked wiring board 501 are electrically connected by solder or the like. Since the stacked wiring board 501 and the plate 1200 can be three-dimensionally stacked, it is possible to miniaturize the power conversion device.

The power semiconductor module 300 is inserted into the flow path forming body 1000 such that the sealing resin surface 900A is in contact with the wall surface 1001 of the flow path forming body 1000. As a result, the power semiconductor module 300 is arranged such that the distal end of the fin 910A of the heat-dissipating portion 910, formed so as to be substantially flush with the sealing resin surface 900A, abuts on the wall surface 1001 of the flow path forming body 1000. Therefore, the refrigerant flowing between the heat-dissipating portion 910 and the wall surface 1001 is prevented from flowing between the sealing resin surface 900A and the wall surface 1001, between the distal end of the fin 910A and the wall surface 1001, and the like as bypass flow. Since the heat-dissipating portion 910 is formed of the high thermal conductor 920 having high thermal conductivity, it is possible to efficiently cool the heat of the power semiconductor. Therefore, the power semiconductor module 300 of the present embodiment is excellent in reliability.

In addition, the flow path through which the refrigerant flows is configured using a combination of the structure of the fin 910A formed on the power semiconductor module 300 side and the wall surface 1001 on the plane formed on the flow path forming body 1000 side. As the structure is simplified in this manner, it is easy to manufacture the power conversion device 200.

The flow path forming body 1000 is not particularly limited as long as it has a watertight structure, and can be manufactured using metal such as aluminum and aluminum die casting, a thermoplastic resin such as polyphenylene sulfide (PPS), polybutylene terephthalate, polyamide, polyimide, and polytetrafluoroethylene, or a thermosetting resin such as an epoxy resin. The flow path forming body made of a resin such as PPS is advantageous in terms that it is light in weight and can be formed into a complicated shape as compared with aluminum, but is disadvantageous in terms that the rigidity is low. Thus, there is a disadvantage that a size increases to secure the rigidity in a seal structure in which sealing is performed by compression of a predetermined amount as in an O-ring. In the seal structure in which sealing is obtained by adhesion as in the present embodiment, however, there is the effect that it is possible to secure the liquid tightness even if the rigidity of the case containing the semiconductor and the flow path forming body 1000 is low.

Since the refrigerant flows through the fin 910A and the bottom of the power semiconductor module 300, water pressure is applied to these portions. The water pressure applied to the fin 910A is substantially balanced with the opposing water pressure, and thus, does not cause large displacement. On the other hand, the water pressure applied to the bottom surface of the power semiconductor module 300 causes displacement in a direction to push up the power semiconductor module 300. This displacement is applied, as stress, to a connection portion between the bus bar wiring and the terminal 319B, 315B, or 320B through which a large current flows, particularly to a solder-connection portion between the signal terminal 325U, 325S, or 325L and the stacked wiring board 501, and becomes a factor of decreasing terminal connection life. It is possible to provide both effects of the sealing against the refrigerant and the suppression of displacement caused by water pressure by forming the seal portion 900B using the first fixing material 901 and the second fixing material 902 as in the present embodiment.

Figure 12:
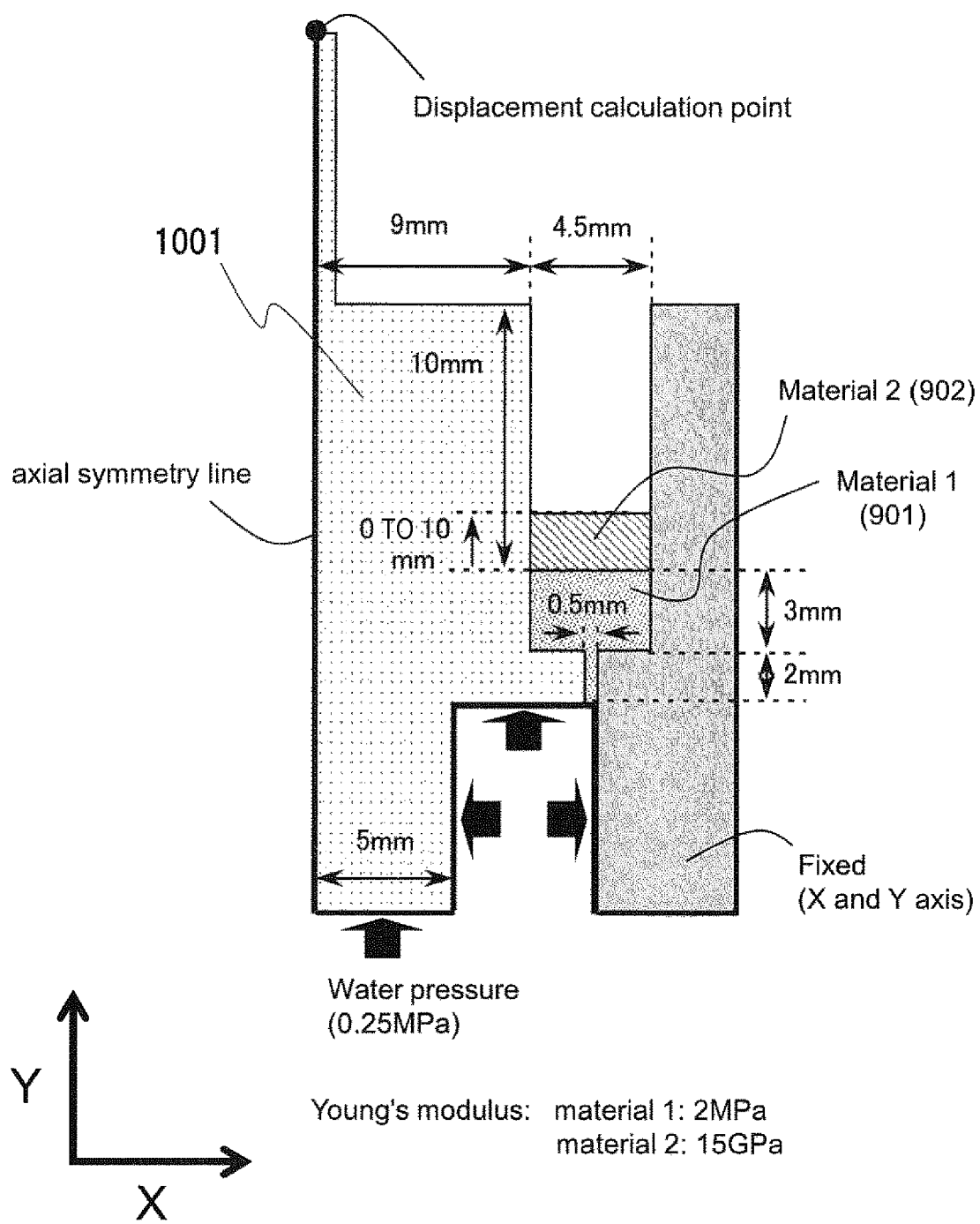
FIG. 12 is an analysis model diagram according to the present embodiment.

FIG. 12 illustrates an analytical model modeling wall surfaces of the power semiconductor module 300 and the water path forming body 1000 by water pressure. As the water pressure, 0.25 MPa which is a maximum water pressure to inject the refrigerant at the beginning was applied in a direction indicated by a thick arrow. In addition, the wall surface 1001 of the water path forming body 10000 was completely fixed. A material 1 having a Young's modulus of 2 MPa was used as the first fixing material 901, and a material 2 having a Young's modulus of 15 GPa was used as the second fixing material 902. Displacement caused by water pressure at a displacement calculation position assumed for a terminal portion of the power semiconductor module 300 was obtained while setting a thickness of the material 1 to 3 mm and changing a thickness of the material 2 from 0 to 10 mm.

Figure 13:
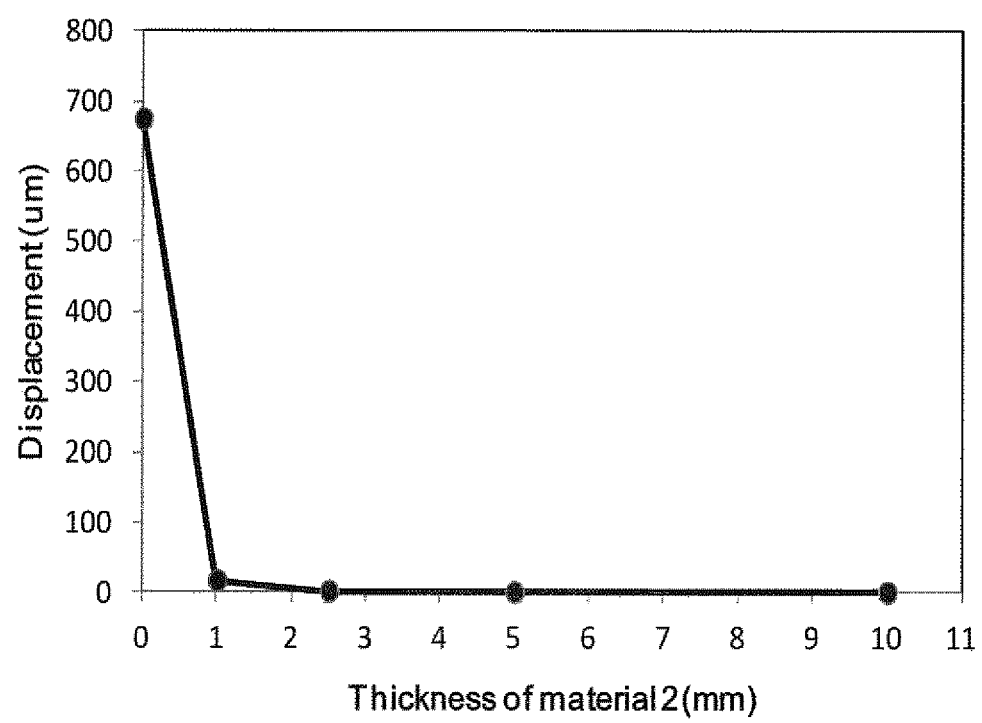
FIG. 13 is an analysis result diagram according to the present embodiment.

FIG. 13 illustrates a relationship between the displacement and the thickness of the material 2. When the material 2 was 0 mm, displacement of about 700 μm occurred, but the displacement was greatly reduced when the material 2 was provided such that the displacement was reduced to be less than 20 μm when the thickness of the material 2 was 1 mm or more. In this manner, it was found that it is possible to suppress the displacement applied to the terminal connection portion of the power semiconductor module by forming the material having the high elastic modulus as the second fixing material 902 even if the material having the low elastic modulus that is highly compatible with the displacement is used for the first fixing material 901.

Figure 14:
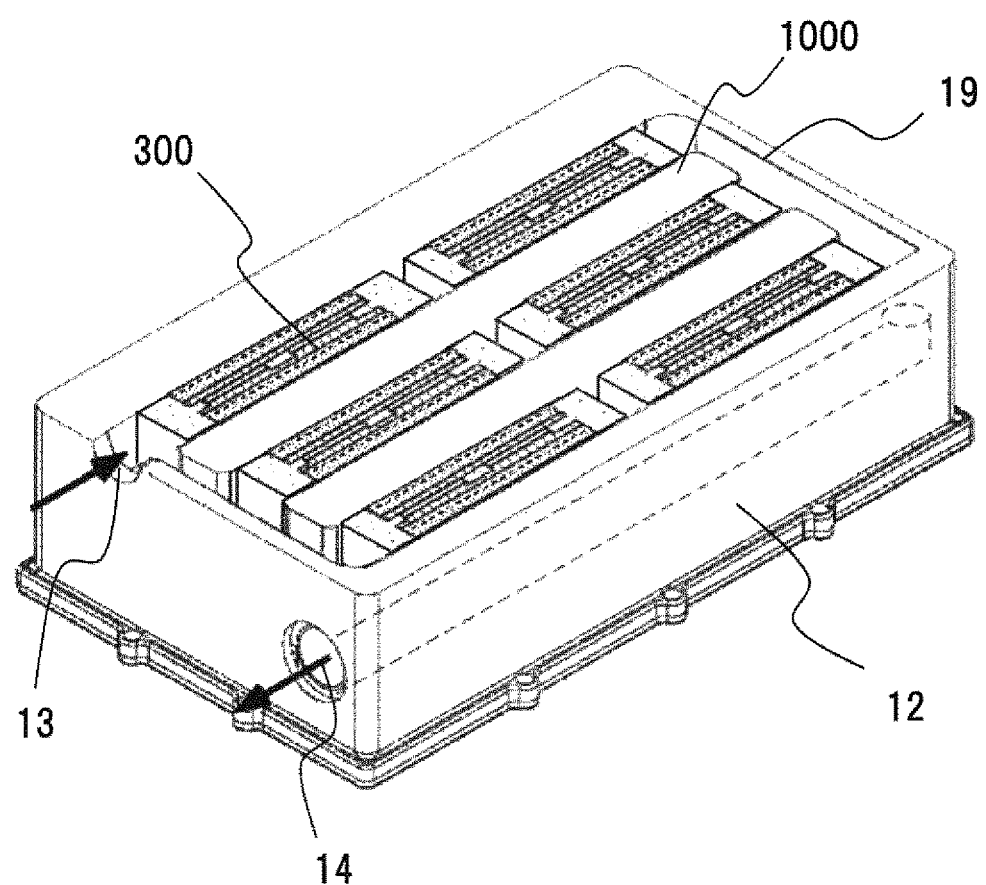
FIG. 14 is a cross-sectional view of a power conversion device 200 according to the present embodiment.

FIG. 14 is a cross-sectional view of a section A of FIG. 10. The housing 12 forms the flow path forming body 1000. The refrigerant flowing into a water path 19 from the cooling water inlet 13 flows in the water path 19 as indicated by arrows and is discharged from the cooling water outlet 14. In the present embodiment, the six power semiconductor devices 300 are arranged along the flow of cooling water in the flow path 19.

Figure 15:
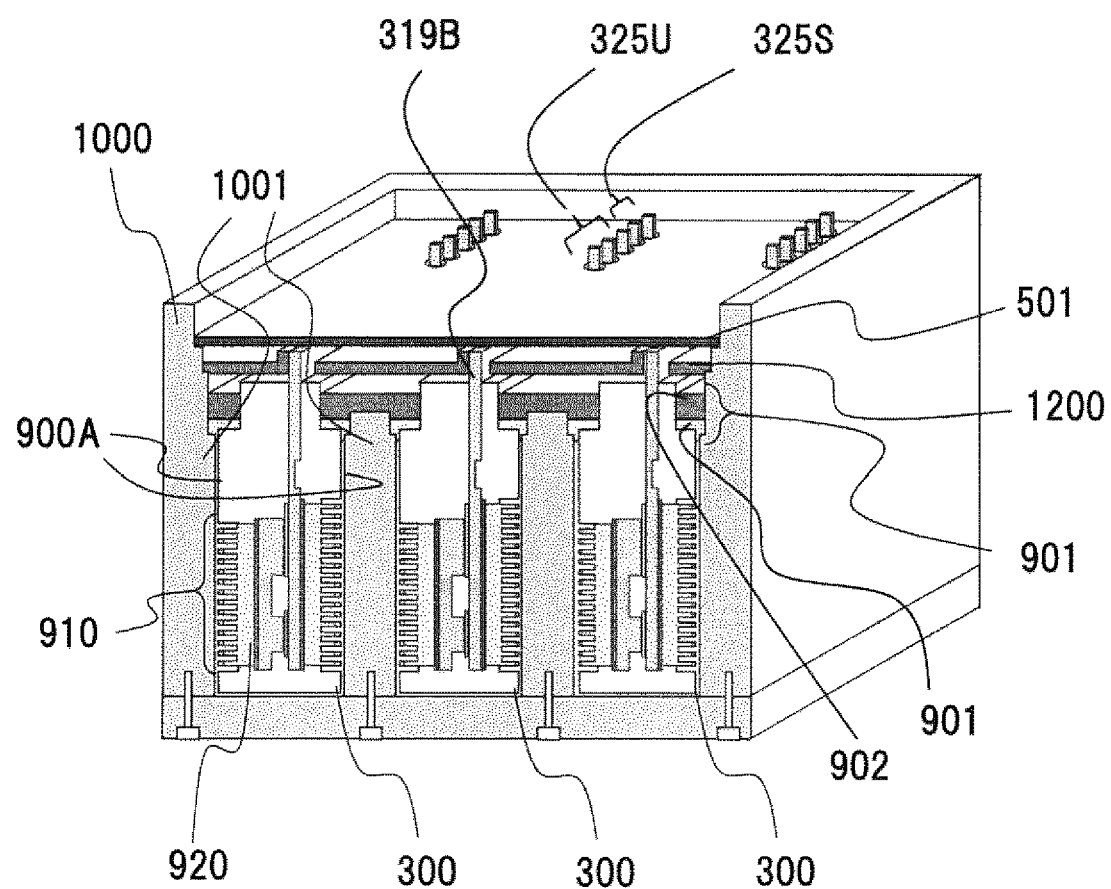
FIG. 15 is Modification 1 of the power conversion device of Example 1.

FIG. 15 is a schematic view illustrating a modification of the power conversion device 200 according to the first embodiment. A change point from FIG. 11 is that a portion of the wall surface 1001 of the flow path forming body 1000 sandwiched between the power semiconductor modules 300 is buried in the second fixing material 902. Since it is possible to inject the adjacent second fixing materials 902 at once, there is an effect that movement of a nozzle at the time of injection is little so that the productivity can be improved.

Example 2

A second embodiment of the present invention is different from the first embodiment in terms that a thermosetting silicone resin cured product having an elastic modulus of 2 MPa is used as the first fixing material 901. The moisture-curable silicone resin used in the first embodiment requires one to several days for curing and the production speed is low. On the other hand, a curing condition of the thermosetting silicone resin is as short as one hour at 100° C. so that the production speed is high. Since the thermosetting epoxy resin used for the second fixing material 902 and the silicone resin have different solubility parameters and are not compatible, and thus, are not mixed with each other even if being applied in an uncured states so that it is possible to obtain a cured product in a two-layer state. After applying the thermosetting silicone resin of the first fixing material 901, the thermosetting epoxy resin of the second fixing material 902 is applied in the uncured state, and the first fixing material 901 and the second fixing material 902 are cured at once under a curing condition of three hours at 120° C., whereby there is an effect that it is possible to improve the production speed without increasing the energy during production.

Example 3

Figure 16:
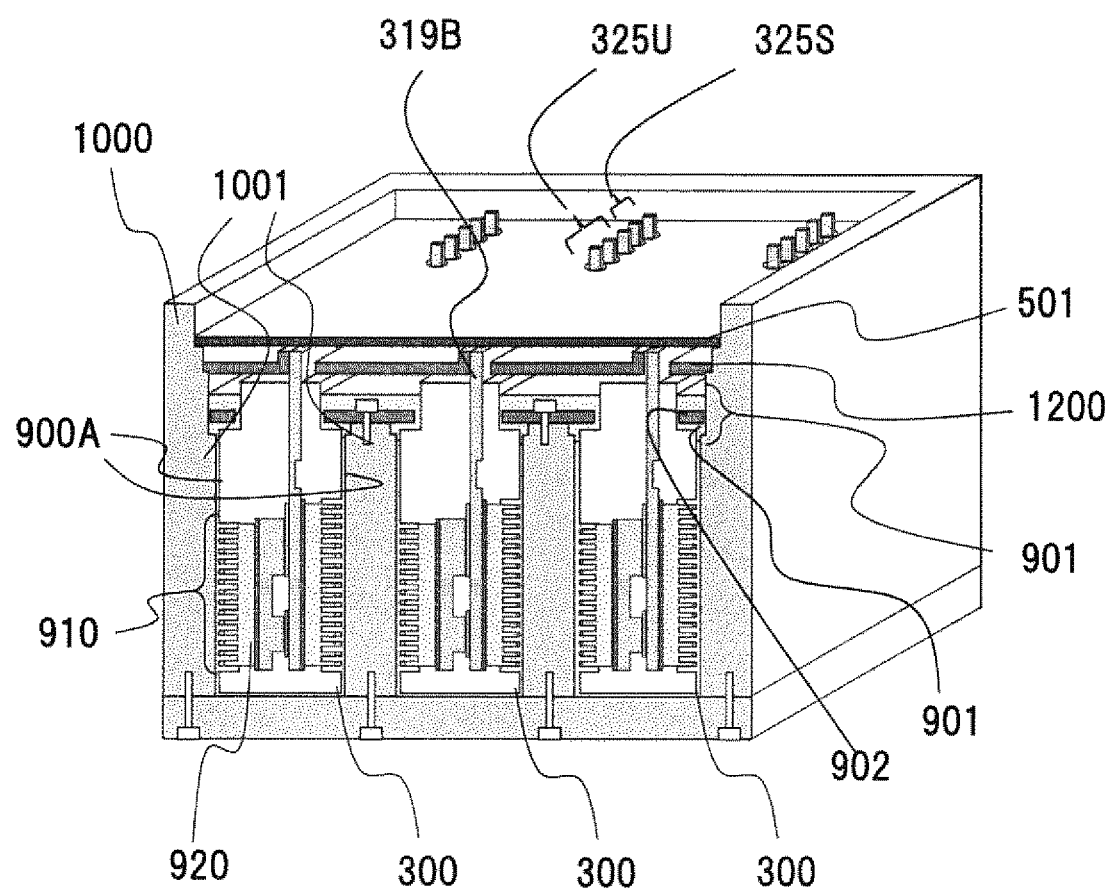
FIG. 16 is a cross-sectional perspective view of a power conversion device 200 of a third embodiment.

FIG. 16 is a schematic view illustrating a sectional structure of the power conversion device 200 according to a third embodiment. A difference from the first embodiment is that a urethane resin cured product having an elastic modulus of 2 MPa is used as the first fixing material 901 and a resin plate having an elastic modulus of 18 GPa consisting of PPS mechanically fixed to the flow path forming body 1000 is used as the second fixing material 902. As the urethane resin, a two-component waterproof urethane resin was used. A curing condition is two hours at 100° C. Since the second fixing material is mechanically fixed, there is an effect that production speed is high. In addition, a urethane resin is superior in reactivity to an epoxy resin, and thus, there is an effect that it is possible to reduce energy required for the effect. The urethane resin as the first fixing material 901 is injected from above the second fixing material 902. As a result, there is an effect that movement of a nozzle at the time of injection is little so that it is possible to improve the productivity.

Figure 17:
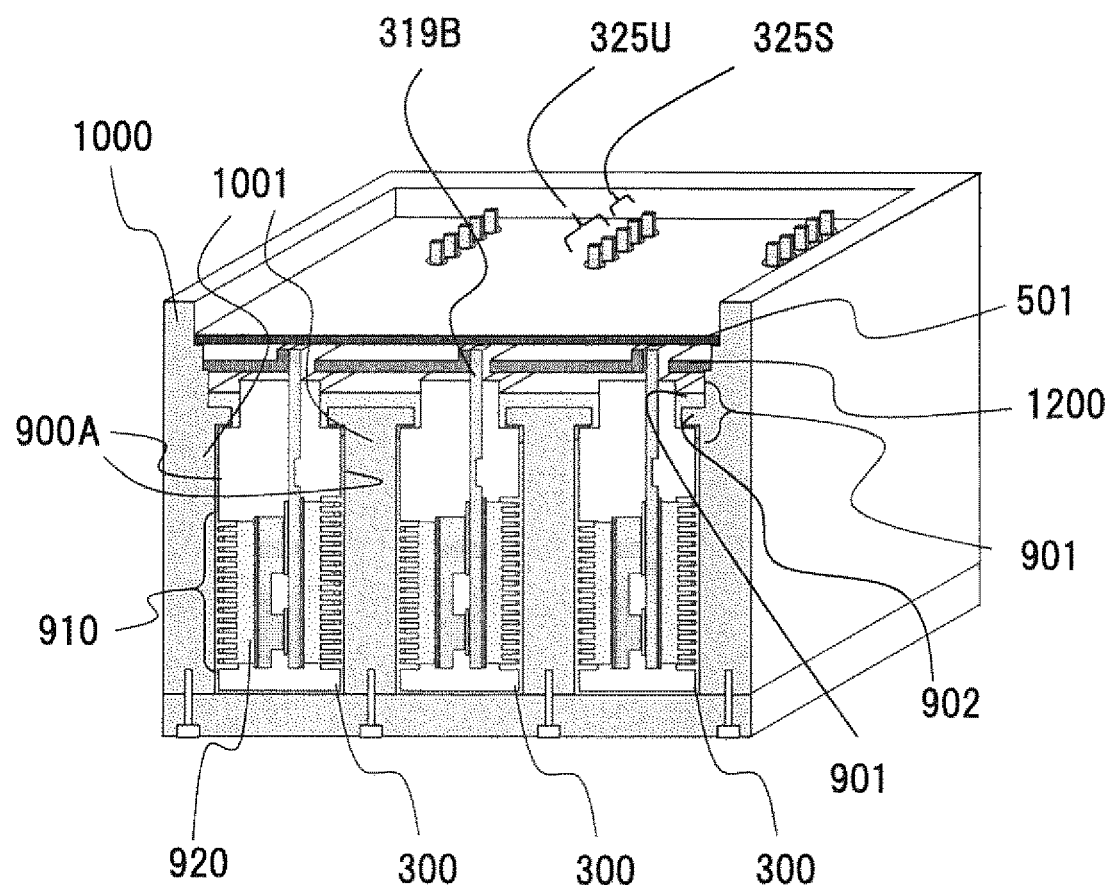
FIG. 17 illustrates Modification 2 of the power conversion device 200 of the third embodiment of the present invention.

FIG. 17 is a schematic view illustrating a sectional structure of the power conversion device 200 according to a modification of the third embodiment. As the second fixing material 902, a protrusion that covers a part of a case housing a power semiconductor in a direction of displacement caused by water pressure is formed in advance in the flow path forming body 1000. By forming the second fixing material 902 in advance in the flow path forming body 1000, there is an effect that there is no need of mechanical fixing so that the productivity becomes excellent. A resin having an elastic modulus of 18 GPa consisting of PPS was used as the flow path forming body 1000. As the flow path forming body 1000 is made of the resin, there is an effect that it is easy to form a complicated shape.

Example 4

Figure 18:
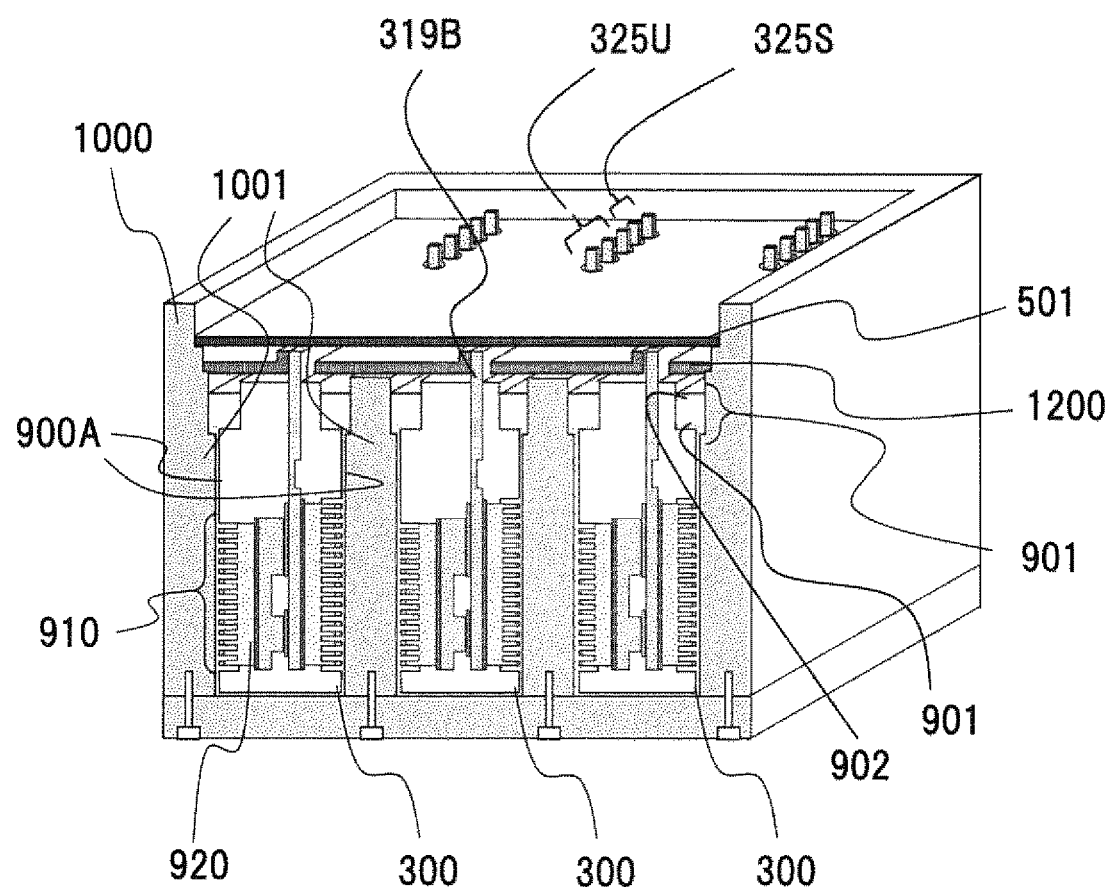
FIG. 18 is a cross-sectional perspective view of a power conversion device 200 of a fourth embodiment of the present invention.

FIG. 18 is a schematic view illustrating a sectional structure of the power conversion device 200 according to a fourth embodiment. A change point from the first embodiment is that the first fixing material 901 and the second fixing material 902 are graded materials. A urethane resin having an elastic modulus of 2 MPa was applied in advance, and then, an epoxy resin was applied in an uncured state. The urethane resin and the epoxy resin were partially compatible in the vicinity of an interface to become a graded material. Since the first fixing material 901 and the second fixing material 902 are partially compatible, the first fixing material 901 and the second fixing material 902 are in close contact with each other so that an effect that the second fixing material 902 suppresses displacement of the first fixing material 901 is high.

Example 5

Figure 19:
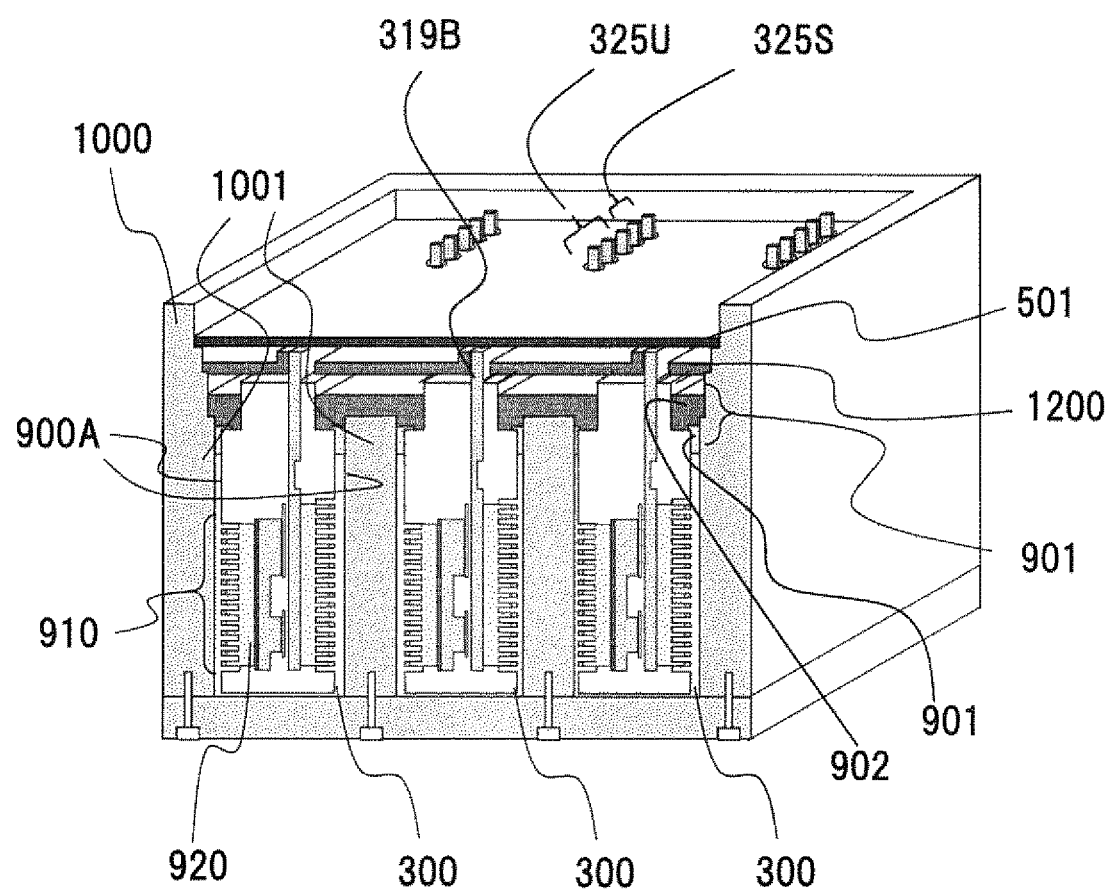
FIG. 19 is a cross-sectional perspective view of a power conversion device 200 of a fifth embodiment of the present invention.

FIG. 19 is a schematic view illustrating a sectional structure of the power conversion device 200 according to a fifth embodiment. Change points from the first embodiment are that a polyethylene terephthalate (PTFE) tape is used for the first fixing material 901 and that a ultraviolet (UV)-curable resin cured product is used for the second fixing material 902. A waterproof tape was wound around a case housing a power semiconductor, the resultant was inserted into the water path forming body 1000, and then, a UV-curable resin was injected as the second fixing material 902. Thereafter, the UV-curable resin was cured by being irradiated with ultraviolet rays for about one minute. It is possible to apply energy only to the vicinity of resin for curing by using the UV-curable resin, and thus, there is an effect that it is possible to reduce energy during production. In addition, a curing time is shortened by the irradiation with the high-intensity ultraviolet rays so that there is an effect that it is possible to significantly improve production speed.

Comparative Example 1

Figure 20:
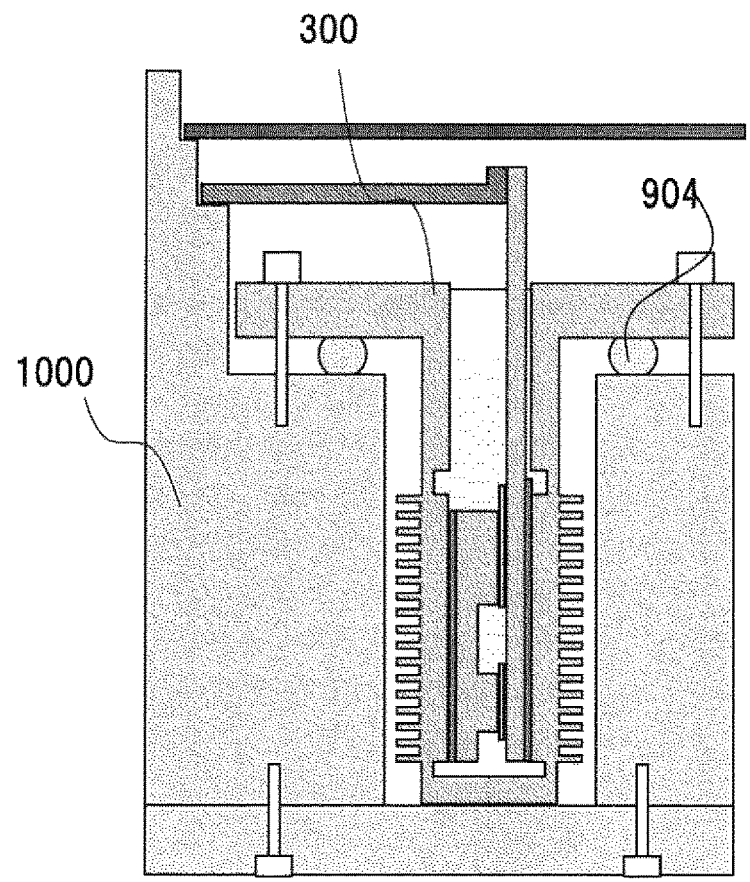
FIG. 20 is a cross-sectional view of a power conversion device of Comparative Example 1 of the present invention.

FIG. 20 is a schematic view illustrating a sectional structure of a power conversion device according to Comparative Example 1. An O-ring 904 secures liquid tightness between the power semiconductor module 300 and the water path forming body 1000. A mechanical fixing structure for compressing the O-ring 904 and a rigidity for compressing the O-ring were required, and a size was increased.

Comparative Example 2

Figure 21:
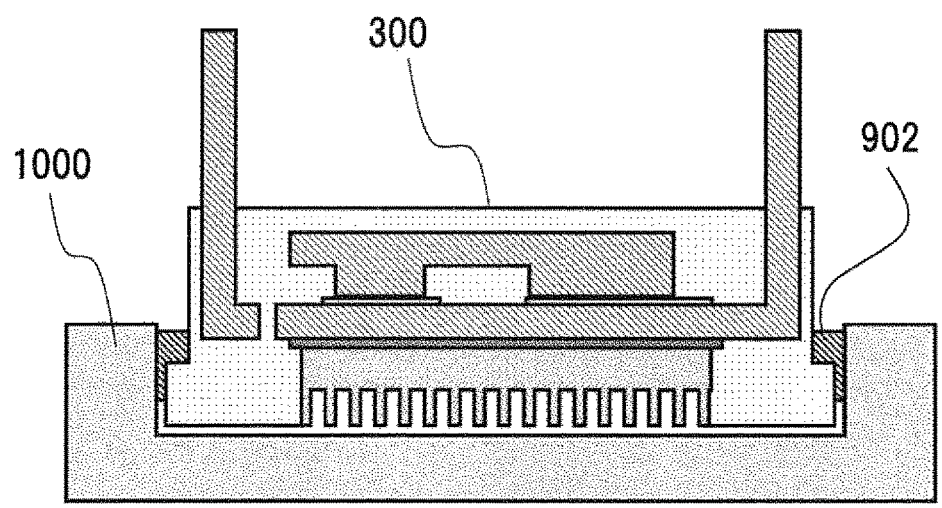
FIG. 21 is a cross-sectional view of a power conversion device of Comparative Example 2 of the present invention.

FIG. 21 is a schematic view illustrating a sectional structure of a power conversion device according to Comparative Example 2. An epoxy resin cured product having an elastic modulus of 15 GPa is formed on the power semiconductor module 300 and the water path forming body 1000 to secure liquid tightness. Cracks were generated in the epoxy resin cured product due to a difference in displacement caused by water pressure, vibration, and heat between the water path forming body 1000 and the power semiconductor module so that the liquid tightness deteriorated.

REFERENCE SIGNS LIST

10 upper case
12 housing
13 cooling water inlet
14 cooling water outlet
16 lower case
17 connector
18 cable
19 flow path
21 signal connectors
155 IGBT for upper arm
156 diode
157 IGBT for lower arm
158 diode
200 power conversion device
300 power semiconductor module
315 lead frame
315B terminal
318 lead frame
319 lead frame
319B terminal
320 lead frame
320B terminal
325L terminal
325S terminal
501 stacked wiring board
510 DC power supply connector
512 DC power supply connector
900 sealing resin
900A sealing resin surface
900B seal portion
901 first fixing material
902 second fixing material
904 O-ring
910 heat-dissipating portion
910A fin
910B sealing resin piece
910C heat-dissipating surface
912 tie bar
920 high thermal conductor
930 collector-side lead set
931 emitter-side lead set
940 insulating layer
945 temperature sensor
950 lead assembly
960 transfer molding die
961 transfer molding die
965 plunger
1000 flow path forming body
1001 wall surface
1001A planar structural body
1200 plate
1300 multi-blade

The invention claimed is:

1. A power semiconductor module comprising:
   a case that houses a power semiconductor and is fixed to a flow path forming body;
   a first fixing material in contact with a refrigerant; and
   a second fixing material that is in contact with the first fixing material and the flow path forming body and covers a direction of displacement of the case of the first fixing material caused by water pressure.

2. The power semiconductor module according to claim 1, wherein an elastic modulus of the first fixing material is lower than an elastic modulus of the second fixing material.

3. The power semiconductor module according to claim 1, wherein the first fixing material is a resin.

4. The power semiconductor module according to claim 1, wherein the first fixing material is a resin cured product.

5. The power semiconductor module according to claim 1, wherein the second fixing material is a resin cured product.

6. The power semiconductor module according to claim 1, wherein the elastic modulus of the first fixing material is between 0.1 MPa and 1 GPa, and the elastic modulus of the second fixing material is 4 GPa or higher.

7. The power semiconductor module according to claim 1, wherein the first fixing material has a weight loss rate of 10% or less after exposure to saturated steam of 2 atm at 120° C. for 168 hours.

8. The power semiconductor module according to claim 1, wherein the first fixing material is a cured product of a resin having a thixotropy of 1.5 or higher.

9. The power semiconductor module according to claim 1, wherein the first fixing material is a low-elastic-modulus portion of a graded material and the second fixing material is a high-elastic-modulus portion of the graded material.

10. The power semiconductor module according to claim 1, wherein the first fixing material is a silicone resin.

11. The power semiconductor module according to claim 1, wherein the first fixing material is a urethane resin.

12. The power semiconductor module according to claim 1, wherein the second fixing material is an ultraviolet-curable resin.

13. A power conversion device comprising:
  the power semiconductor module according to claim 1; and
  a flow path forming body that forms a flow path with an outer surface of the case.

14. A method for manufacturing a power conversion device comprising:
  a first step of housing a case that houses a power semiconductor in a flow path of a flow path forming body;
  a second step of arranging a first fixing material so as to come into contact with a refrigerant flowing in the flow path; and
  a third step of arranging a second fixing material so as to come into contact with the first fixing material and the flow path forming body and cover a direction of displacement of the case of the first fixing material caused by water pressure,
  wherein the first fixing material or the second fixing material, or the first fixing material and the second fixing material are formed by curing a liquid resin.

* * * * *